United States Patent [19]

Fleming et al.

[11] Patent Number: 5,047,369

[45] Date of Patent: Sep. 10, 1991

[54] FABRICATION OF SEMICONDUCTOR DEVICES USING PHOSPHOSILICATE GLASSES

[75] Inventors: Debra A. Fleming, Lake Hiawatha; David W. Johnson, Jr., Pluckemin; Shobha Singh, Summit; LeGrand G. VanUitert, Morristown; George J. Zydzik, Columbia, all of N.J.

[73] Assignee: AT&T Bell Laboratories, Murray Hill, N.J.

[21] Appl. No.: 345,924

[22] Filed: May 1, 1989

[51] Int. Cl.$^5$ .................. C03C 3/00; H01L 21/02
[52] U.S. Cl. .................. 437/240; 427/42; 501/12; 501/54; 501/63; 148/DIG. 133; 204/192.23
[58] Field of Search .............. 65/18.1, 32.1; 427/96, 427/42; 501/12, 54, 55, 63; 437/229, 238, 240, 243; 148/DIG. 133; 204/192.23

[56] References Cited

U.S. PATENT DOCUMENTS

| | | | |
|---|---|---|---|
| 3,616,403 | 10/1971 | Collins et al. | 357/52 |
| 3,743,587 | 7/1973 | Kennedy | 204/192 |
| 3,767,432 | 10/1973 | Thomas | 106/52 |
| 3,767,434 | 10/1973 | Thomas | 106/52 |
| 4,374,391 | 2/1983 | Camlibel et al. | 357/17 |
| 4,407,061 | 10/1983 | Grodkiewicz et al. | 29/576 B |
| 4,419,115 | 12/1983 | Johnson, Jr. et al. | 501/12 |
| 4,474,831 | 10/1984 | Downey | 437/229 |
| 4,731,293 | 3/1988 | Ekholm et al. | 428/426 |
| 4,732,658 | 3/1988 | Lee | 204/192.23 |
| 4,819,039 | 4/1989 | Chi et al. | 357/73 |

OTHER PUBLICATIONS

IBM Technical Disclosure Bull., vol. 9, No. 11 (Apr. 1967), p. 1645.
"Sol Gel Processing of Ceramics and Glass", *Ceramic Bulletin*, vol. 64, No. 12 (1985), David W. Thomas, Jr., pp. 1597-1602.

Primary Examiner—Olik Chaudhuri
Assistant Examiner—Andrew Griffis
Attorney, Agent, or Firm—Oleg E. Alber

[57] ABSTRACT

This invention is directed to a process of producing semiconductor devices which involves deposition of protective glass layers by a particle beam technique from targets of phosphosilicate glass, as well as a process for production of such targets. The phosphosilicate glass containing 1-15 mole percent $P_2O_5$ is produced by a sol/gel technique which involves mixing of a fumed silica, with a surface area of 50-400 m$^2$/g, preferably about 200 m$^2$/g, with phosphoric acid and water to form a sol with 20-55 wt. % silica, allowing it to gel, drying at ambient conditions, dehydrating at about 650° C. in an atmosphere of an inert gas and chlorine and fluorine containing gases, heating up at a certain rate of from 100° to 180° C. per hour to a peak sintering temperature below 1200° C. and cooling so as to produce amorphous and transparent glass suitable for use as a target. The glass layers are highly advantageous as encapsulating layers, diffusion barrier layers, etc., especially for optical type and semiconductor devices. Production of the phosphosilicate glass by the sol/gel technique is highly advantageous over the conventional melting technique, being faster and much less expensive than the latter.

41 Claims, 2 Drawing Sheets

FABRICATION OF SEMICONDUCTOR DEVICES USING PHOSPHOSILICATE GLASSES

TECHNICAL FIELD

This invention involves a process for fabricating semiconductor devices using phosphosilicate glasses.

BACKGROUND OF THE INVENTION

Fabrication of semiconductor devices often requires use of capping or encapsulating surface layers for surface protection and pattern delineation. Such surface layers are useful during the fabrication as well as on completed devices.

U.S. Pat. No. 4,731,293 issued on Mar. 15, 1988 to D. T. Ekholm et al., which is incorporated herein by reference, describes the use of phosphosilicate glass (PSG) in the production of semiconductor devices including devices comprising III–V and II–VI compound semiconductors, such as GaAs and InP and compound semiconductors lattice matched to GaAs and InP. The PSG comprises at least 60 mole per cent silica and up to 25 mole percent $P_2O_5$ and may contain up to ten mole per cent of other components such as $B_2O_3$, rare earth oxides ($R_2O_3$), etc., with less than one percent being preferred. The PSG is deposited on the semiconductor by a particle-beam deposition including e-beam deposition and sputtering. E-beam deposition is preferred because the surface of the semiconductor on which the phosphosilicate glass is being deposited is less likely to be damaged and involve contamination of the semiconductor surface. To be useful for particle beam deposition the glass should be of homogeneous composition, amorphous and transparent.

Prior art procedure for the preparation of PSG targets for e-beam deposition, as described in the above mentioned U.S. Pat. No. 4,731,293, involves dry milling of ingredients in a dry, inert atmosphere followed by heat treatments to react the component oxides, make the glass uniform and remove moisture and/or bubbles. The heat treatments include heating a milled mixture of ingredients in an oxygen containing atmosphere at a temperature between 1300° and 1500° C. for five days, and heating the resultant glass at 1850°±50° C. for 5 days in an inert, e.g. argon, atmosphere.

This procedure is very expensive and energy and time consuming. Furthermore, during the high temperature firing some of the phosphorus present in the initial ingredients is lost. For example, a starting material containing 12 mole percent $P_2O_5$ may yield a final glass with about 10 mole percent $P_2O_5$. This leads to difficulties in obtaining PSG with lower $P_2O_5$ content, such as 1–15 mole percent $P_2O_5$. Therefore, it is desirable to produce the PSG targets by a process which would overcome disadvantages of prolonged heating at high temperatures.

SUMMARY OF THE INVENTION

The invention is a process for fabricating semiconductor devices, especially devices comprising III–V and II–VI compound semiconductors, which involves preparation of phosphosilicate glass (PSG) for use as a cap or encapsulation. The PSG which acts as an effective encapsulant and diffusion barrier, is particularly useful in the fabrication of semiconductor devices requiring temporary or permanent capping or encapsulation, such as avalanche photodiodes. The process includes preparation of the PSG for use in deposition on a semiconductor surface by a particle beam deposition procedure.

In accordance with the present invention, the preparation of the PSG involves a colloidal sol-gel method, densification at a temperature of less than 1200 degrees C and much shorter processing times than are needed for the conventional melting preparation. The present preparation includes mixing fumed silica with surface area within a range of from 50 to 400 $m^2/g$, water and phosphoric acid to form a sol. This sol is allowed to gel, dried at low temperature, such as an ambient temperature, and is then exposed to a number of heat treatments at temperatures and time intervals sufficient to achieve dehydration and sintering. The dried gel form is heated to a desired dehydration temperature at a relatively rapid rate of greater than 100° C. per hour, such as 300° C. per hour, until the desired dehydration temperature is reached. Typically, dehydration is achieved at a temperature of greater than 400° C., preferably in the range of from 500 to 700 degrees C, conducted generally for times ranging from 10 minutes to three hours. Sintering is generally achieved in the temperature range from 600 to 1200 degrees C, preferably from 1000° to 1200° C., with gels produced with silica having higher surface area sintering at lower temperatures within this range. A heating rate within a range of from 100 to 180 degrees C per hour from the dehydrating temperature to an optimal peak sintering temperature yields excellent results. After this sintering temperature is reached, the glass product is cooled sufficiently rapidly to prevent crystallization. The dehydration and sintering are conducted in an inert gas atmosphere, e.g. helium. Gases such as $Cl_2$, $SiF_4$, fluorocarbons, chlorofluorocarbons and $CCl_4$, may be included at least during the dehydration to facilitate removal of water and impurities from pores of the dried gel. Glasses prepared by the inventive process yield pore-free, transparent targets with homogeneous composition.

DETAILED DESCRIPTION

Figure 1:
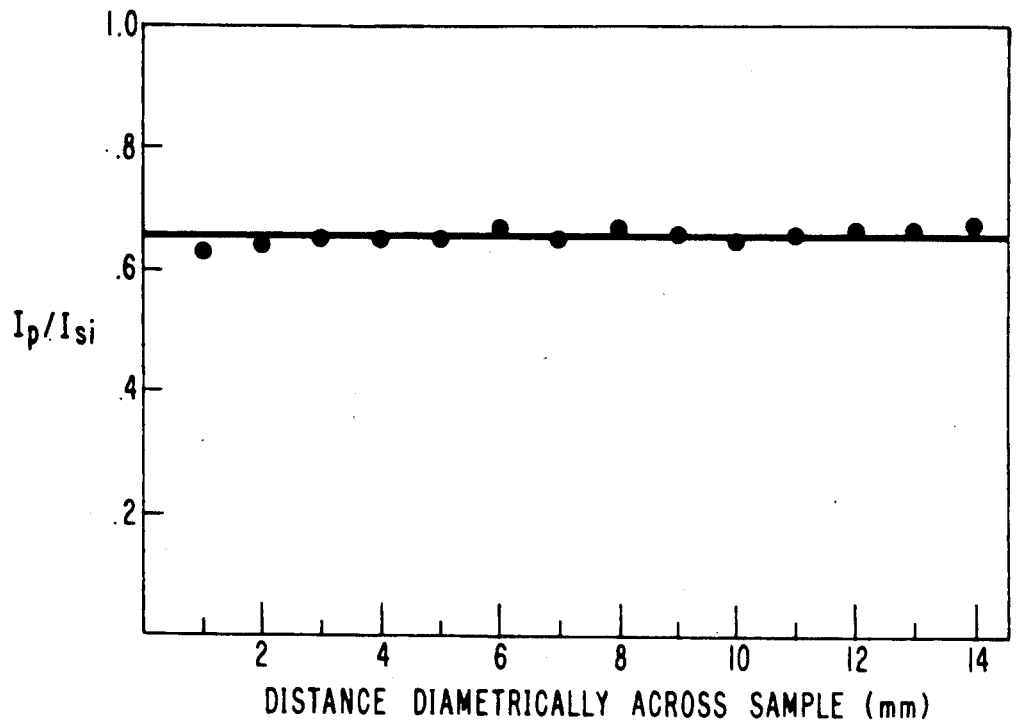
FIG. 1 discloses relative intensity of $I_p/I_{Si}$ measured by X-ray Fluorescence versus Position (distance diametrically across a dried gel sample), in mm., as a measure of phosphorus distribution across the sample.

This invention is based on the discovery that phosphosilicate glass (PSG) comprising $P_2O_5$ within a certain composition range prepared by a specific procedure as described hereinbelow may be effectively used in the fabrication of semiconductor devices in place of the PSG prepared by the conventional melting procedure such as disclosed in U.S. Pat. No. 4,731,293 mentioned above.

In the fabrication of semiconductor devices ion-implantation is commonly used to attain required dopants. The implantation process results in the damage to the lattice that must be removed. Post-implant annealing at elevated temperatures (e.g. between 700°–800° C. for InP and 800°–1000° C. for GaAs) reconstructs the damaged lattice and activates the implanted species.

However, heating of such III–V compound semiconductors as InP, GaAs, and compound semiconductors lattice matched to InP and GaAs, such as InGaAs, InGaAsP, AlInAs, AlInAsP, and others, to these temperatures results in serious degradation of the surface due to volatilization of P or As. It is therefore useful to cap or encapsulate at least the implanted surface of the semiconductor to avoid this decomposition. It is important that the capping (encapsulating) material is stable at high temperature and does not react with or diffuse into the semiconductor.

PSG coating has unusually good properties as a barrier or encapsulating layer during fabrication of integrated circuits, or as a passivating layer especially on devices comprising the III–V compound semiconductors. Application of the PSG by Chemical Vapor Deposition (CVD) has not always led to satisfactory results due to porosity and P composition control problems. On the other hand, e-beam evaporation of PSG for use as encapsulants in rapid thermal anneal of Si-implanted III–V compound semiconductors such as GaAs and InP and in the fabrication of integrated circuits and avalanche photodiodes has been used with success.

Target preparation and composition of the PSG are of primary importance in the practice of the invention. It is highly advantageous to obtain a uniform distribution of phosphorus and silica in the target material because the chemical and physical properties of the deposited glass film depend on the atomic structure of the target material. Electron beam deposition in particular requires use of a nonporous target material in order to achieve a uniform deposition across the surface of the semiconductor. It is also highly desirable for the glass to be amorphous in structure, that is, noncrystalline.

High purity, pore-free PSG targets for e-beam deposition are presently prepared by conventional melting for example as explained in U.S. Pat. No. 4,731,293. This prior method requires the conversion of raw materials to a homogeneous melt conducted at elevated temperatures for long periods of time. Although this method is effective, it is very expensive and energy and time consuming and may lead to the loss of some phosphorus during the high temperature firing. To overcome these disadvantages, a novel technique for preparing glasses of various $P_2O_5$ contents, especially in the range of from 1 to 15 mole percent $P_2O_5$ has been devised. It has inherent advantages over the conventional processing.

The present invention utilizes the sol-gel concept, disclosed in an article by David W. Johnson, Jr. entitled "Sol-Gel Processing of Ceramics and Glass", published in Ceramic Bulletin, Vol. 64, No. 12 (1985) pp. 1597–1602. This article discloses a process of producing $SiO_2$ glass, such as tubing, for use in fabrication of optical waveguide preforms. The process includes steps of preparing a colloidal sol of fumed silica in water, allowing it to gel, drying, dehydrating, and sintering at temperatures from 1300° to 1500° C. However, this article teaches that uniform addition of dopants to colloidal sol-gels is difficult and may lead to trapped pores after sintering.

The present invention involves preparation of phosphosilicate glasses of varying $P_2O_5$ contents utilizing the sol-gel technique to yield at temperatures below 1200° C. a homogeneous, transparent, pore-free phosphosilicate glass suitable for e-beam deposition onto a semiconductor surface without the use of excessively high temperatures. The advantage of the present method over conventional melting procedures used in glass target preparation is that the sol-gel technique allows rapid and low-temperature processing from inexpensive starting materials without significant loss of phosphorus through volatilization. The high surface area of the dried gel results in high reactivity which in turn permits low temperature densification. Thus, the process is rapid and volatilization of phosphorus is minimized. Also, since prior to densification the gel is about 50 to 80% porous, very high purity can be attained by densifying in an atmosphere including an inert gas, such as helium, and gases such as $Cl_2$, $SiF_4$, fluorocarbons, chlorofluorocarbons, and $CCl_4$. Under these conditions any entrapped water and most of the transition metal impurities are removed as volatile chlorides. In general, the whole process of preparing the PSG targets is rapid and inexpensive, compared to the prior art conventional melting process.

The preparation procedure of the invention involves mixing colloidal silica with water and aqueous phosphoric acid to form a porous phosphosilicate gel which is shaped (if desired), dried and subsequently fired. By controlling both the drying rate of a gel form and the firing conditions a pore-free, homogeneous glass can be fabricated expeditiously.

The term "phosphoric acid" contemplates the various species thereof. Thus, for example, such compounds as $H_3PO_4$, $H_4P_2O_7$, $HPO_3$, $H_4P_2O_6$, as well as various species of the phosphorus acid such as $H_3PO_3$, $H_3PO_2$, $H_4P_2O_5$ are included. Of these, orthophosphoric acid, $H_3PO_4$, is preferred.

The initial step in target preparation is to disperse commercially available fumed $SiO_2$ in distilled water, such as triply-distilled water, using a shear blender to form a sol containing silica within a range of from 20 to 55%, silica by weight. Addition of an excessive amount of water e.g. in excess of 70 weight percent, may lead to sols which are difficult to gel, and which will lead to an extended drying and dehydrating time with a possible loss of some phosphorus on drying. On the other hand, addition of an amount of water, e.g. 20 weight percent, which is insufficient for satisfactory dispersion of silica in water, and thus of the phosphoric acid in the sol, may result in difficulty in obtaining a homogeneous sol. The water is triply distilled to reduce the presence of unwanted ions which could unfavorably affect the semiconductor surface capped or encapsulated with resultant PSG. Reagent grade aqueous phosphoric acid (85 weight % $H_3PO_4$) is added in appropriate quantities to form sols containing a desired proportion of $P_2O_5$ in the resultant PSG. The dispersed sol is then cast into a suitable form, such as rods or wafers, allowed to gel, removed from the mold and dried under ambient or high humidity conditions for a period of up to 14 days, preferably 3 days or less. Instead of casting, the sol may be poured into a large vessel in which it is allowed to gel and then to dry. This results in dried gel fragments from a few millimeters to a few centimeters in size.

In the practice of the invention, fumed silica having particle surface area ranging from 50 to 400 m$^2$/g may be used. Gels formed with silica having higher surface area, such as about 300–400 m$^2$/g, have the ability to absorb greater quantities of phosphorus (e.g., higher than 10–15 mole percent phosphorus). However, lower surface area materials, such as about 200 m$^2$/g, are preferred because its use allows formation of more concentrated sols. Also, silica having surface area of 150 to 250

$m^2/g$, such as about 200 $m^2/g$, is readily available, manageable and easy to contain.

Colloidal $P_2O_5$-containing $SiO_2$ gels may be prepared in any suitable mixing manner. Two mixing variants have been found to be especially convenient. Both variants, when subjected first to drying and then to a firing schedule described hereinbelow lead to glass targets suitable for e-beam deposition.

In one variant, which could be entitled a "redispersion variant", commercially obtainable fumed $SiO_2$ with a surface area of from 150 to 250 $m^2/g$, such as about 200 $m^2/g$, was dispersed using a shear blender in a volume of triply-distilled water so as to result in from 28 to 32 weight percent $SiO_2$. This sol was dried in a chamber held at temperatures ranging from an ambient temperature to 175° C., preferably at 150° C., yielding fragments of dried gel from a few mm. to a few cm. in size. The dried aggregates were redispersed in a volume of water so as to result in a $SiO_2$ concentration of from 30 to 50% by weight, preferably about 37% $SiO_2$ by wt. After a short period of blending (e.g. approximately 2 mins.) reagent grade aqueous phosphoric acid (85 weight % $H_3PO_4$) was added to the sol and mixed. Further attrition of this sol was accomplished by ball milling in borosilicate jars with $SiO_2$ balls for 24 hrs. The redispersed sol was then cast into a mold (or molds) of a desired shape, allowed to gel, removed from the mold, and dried under ambient or high humidity conditions for a period of up to 14 days, preferably 3 days or less. Alternatively, the sol may be poured into a large vessel where it is allowed to gel and to dry, forming dried gel fragments which when processed as described below, may be used as e-beam targets.

In another variant, gels were fabricated from a single dispersion of fumed $SiO_2$ in water with the addition of $H_3PO_4$ solution. In this variant, commercially obtainable fumed $SiO_2$ with a surface of from 150 to 250 $m^2/g$, such as about 200 $m^2/g$, was dispersed using a shear blender in a volume of triple-distilled water so as to result in a mixture containing from 30 to 50% $SiO_2$ by weight, preferably about 37 percent $SiO_2$ by weight. After a short period of blending (approximately 2 minutes) reagent grade aqueous phosphoric acid (85 weight % $H_3PO_4$) was added to the mixture to yield sols with from 1 to 12 mole percent $P_2O_5$ based on the amount of $SiO_2$, and the mixture was blended for a short period of time sufficient to cause complete dispersion of the sol. The dispersed sol was then cast into a mold of a desired shape, (or poured into a vessel), allowed to gel, removed from the mold and dried under ambient or high humidity conditions for up to 14 days, preferably 3 days or less days. This sol was cast directly from the mixer and did not need to be ball milled. This variant eliminated the need for ball milling which simplifies and considerably shortens the processing. This is significant, especially if the glass is being prepared on a commercial basis. Dried gel in fragment form instead of the cast form, may be formed in the same manner as in the "redispersion" variant.

The relative phosphorus distribution across a dried gel rod was measured by X-ray fluorescence. The importance of slow drying the cast gel is discussed hereinbelow with reference to FIGS. 1 and 2 of the drawings.

FIG. 1 illustrates the relative phosphorus distribution diametrically across the cross-section of a dried gel rod about 15 mm in diameter doped with 20 mole % $P_2O_5$. An X-ray fluorescence spectrometer was employed for this measurement. Analysis of the phosphorus distribution was made by scanning across the specimen using a 0.75 mm X-ray beam in 1 mm steps. FIG. 1 discloses intensity of fluorescence of phosphorus (Ip) relative to the intensity of fluorescence of silicon (Ip) measured by X-ray fluorescence versus position (distance diametrically across a dried gel sample, in mm., as a measure of phosphorus distribution across the sample.) This sample, which had been dried under ambient conditions, showed that a uniform phosphorus distribution can be obtained even in samples containing relatively large amounts of $P_2O_5$.

One explanation for the homogeneity is that phosphorus is very reactive with the silica and becomes bonded to the surface. Provided a sufficient amount of phosphoric acid is available in the solution, up to one phosphoric acid molecule may be absorbed for every silicon atom on the silica surface. Normally, as water evaporates from the surface of a wet doped silica gel body, more solution tends to diffuse from the interior of the body to reduce the concentration gradient. However, in the case of phosphoric acid solutions, the affinity of phosphorus for the $SiO_2$, the lack of crystallization from solution due to slow drying at ambient conditions, and the higher viscosity of the solution due to high solubility of phosphoric acid in water reduces the migration of phosphorus to the surface and permits a uniform doping of phosphorus in a dried $SiO_2$ gel.

Figure 2:
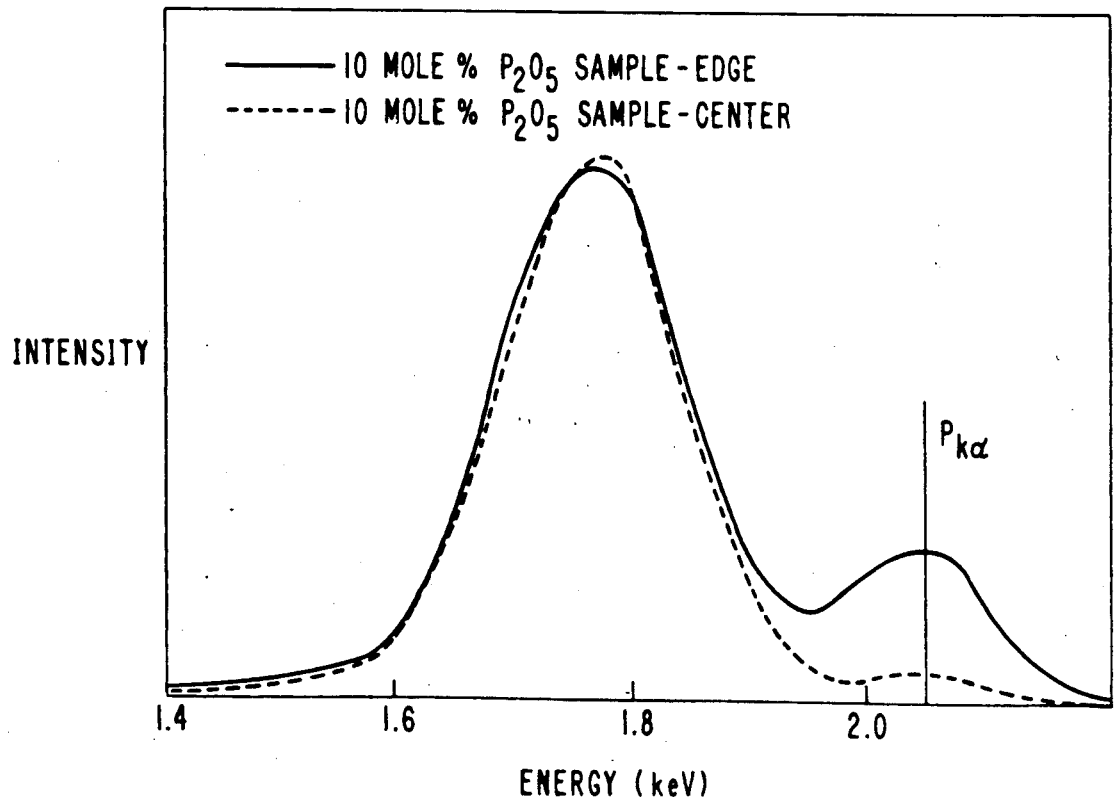
FIG. 2 discloses Energy Dispersive X-ray Analysis Spectra demonstrating the inhomogeneous phosphorus distribution of a rapidly dried gel body.

For comparison, FIG. 2 shows the relative phosphorus distribution across the diameter of a gel rod which had been dried rapidly in a box furnace. The samples had been heated to 100° C. in 3 hours and then held at 100° C. for several more hours. Unlike the sample which had been dried under ambient conditions, this sample exhibited an inhomogeneous phosphorus distribution, with the majority of phosphorus being concentrated at the edges of the sample. The rapid depletion of water from the surface of the gel at high temperature resulted in a steep concentration gradient of water across the sample. Diffusion of water from the center to the surface carried the phosphorus ion, possibly a phosphate, with it. The concentration of phosphate at the surface exceeded its solubility and crystallized before back-diffusion could operate to redistribute it.

The homogeneous, dried gel body was then subjected to firing with an intent to obtain a transparent, amorphous glass body suitable as a target for particle beam deposition. The major obstacles were devitrification during densification (sintering) in view of the tendency of doped colloidal gels to crystallize at elevated temperatures during the final densifying stage and volatilization of phosphorus at elevated temperatures. This volatilization prevents rapid heating to higher temperatures to avoid crystallization. Thus, the successful conversion of a gel into a pore-free glass depends on managing this competition between densification and crystallization.

To overcome these obstacles, the firing steps of dehydration and sintering have been carried out in separate stages. Dehydration removes trace amounts of water from the dried gel whereas sintering consolidates the gel into glass by collapsing the pores with the addition of heat. Dehydration is an important processing step for at least two reasons: first, any water trapped in the gel if not removed prior to sintering will cause bubbles to form in the glass as it sinters, and second, water which remains in the glass will adversely affect the electrical and optical properties of the device on which the glass is deposited.

Dried gel samples were fired in tightly sealed silica muffle tubes 5 cm. (2 inch) in diameter to prevent contamination by ambient gases. Firing occurred in a flowing gaseous atmosphere including an inert gas, and one or more of $Cl_2$, $SiF_4$, fluorocarbons, chlorofluorocarbons or $CCl_4$. Prior to firing the dryed gel is about 50-80% porous. The inert gas is selected on the premise that its molecules should be small enough to pass through pores of the gel so as to assist in removal of water and impurities from the gel. Helium is suitable as one of such inert gases. In the illustrative embodiment, helium was introduced at about 1 liter/min. throughout the entire firing (dehydration and sintering). $SiF_4$ and $Cl_2$ were added at rates of about 30 cc/min. and about 100 cc/min., respectively, at least during the dehydration stage. Chlorine or chlorine-containing gas is added to remove water from the gel. The chlorine reacts with water to form HCl gas which is carried out of the pores with the helium. Furthermore, any transition metal impurities are removed as volatile chlorides.

Dehydration is carried out at temperatures well above room temperature, typically above 400° C. and lower than about 800° C. The latter limit is selected to avoid vaporization of $P_2O_5$ or reaction with the $Cl_2$ which could alter the eventual glass composition. Typically, the gel is heated to a dehydrating temperature in the range of from 500 to 700 degrees C., preferably to about 600-650 degrees C. at a rate of greater than 100° C. per hour, such as about 300 degrees C. per hour, and dehydrated for from 10 minutes to 3 hours, preferably about two hours, in said flowing gaseous atmosphere. Times shorter than 10 minutes, although often sufficient, do not always guarantee dehydration. Times longer than three hours usually are wasteful of time and energy and may result in some loss of phosphorus.

The dehydrated gel body is then sintered. Optimal sintering conditions are both time and temperature dependent, with temperature range for the practice of the invention being also sensitive to the original silica surface area. The driving force for sintering is reduction of surface energy, so that high surface area materials will sinter at lower temperatures. In general, sintering between 900 and 1200 degrees C, depending on silica surface area, will sufficiently collapse the gel pores to yield a homogeneous, pore-free glass, which under proper sintering conditions will sinter to a transparent glass.

For gels produced with silica having a surface area of about 200 $m^2/g$, and containing 5-7 mole percent $P_2O_5$, for example, an optimum sintering temperature is within a range of from 1000° to 1200° C. Below about 1000 degrees C, the dried gel will not sinter completely; the sample will appear partially opaque. Above about 1200 degrees C, bubbles will tend to form in the glass because the high temperature causes phosphorus to vaporize and become trapped in the glass. Suitable optimum temperature ranges for gels produced with silica having different surface areas and different $P_2O_5$ content may be selected by trial and error.

Conversion of the silica gel into the pore-free, noncrystalline glass requires heat-up from the dehydrating temperature to a peak sintering temperature at a rate and holding at that temperature for a period within an appropriate total firing time. A preferred way of practicing the invention is to heat a dehydrated phosphosilicate gel, produced with silica having a surface area of about 200 $m^2/g$, at a rate of from 100 to 180 degrees C per hour, preferably from 130 to 150 degrees C per hour, to an optimal peak sintering temperature between 1050 and 1200 degrees C. Once that sintering temperature is reached, samples are preferably held at that temperature for less than 30 seconds and then are cooled rapidly (e.g. furnace cooled) to prevent crystalline formation. Heat-up rates higher than the proposed range of from 100 to 180 degrees C per hour, for example, 300 degrees C per hour, and higher, such as 600 degrees C per hour, proves too rapid to completely sinter the gel; portions of the sample will appear opaque due to retained porosity. Conversely, a slow heat-up and soak (e.g., holding the sample at the peak sintering temperature for about 15 minutes or more) will allow the sintered glass to begin to crystallize. It is apparent that there is a narrow range of firing conditions which result in pore-free noncrystallized glass. These conditions may be determined for each situation, including surface area of the original silica, percentages of $P_2O_5$ in the gel, and others, by simple trial-and-error.

After sintering, opaque samples were examined by X-ray diffraction to determine if opacity was due to crystallization or porosity. Noncrystalline samples were then examined with a Scanning Electron Microscope (SEM). The phosphorus concentration across sintered specimens was examined by Energy Dispersive Analysis of X-rays (EDAX). Sintered specimens were cut perpendicular to their long axis and polished. The OH-content was determined by measuring the fundamental 2.7 $\mu m$ absorption peak using a Perkin-Elmer infrared spectrometer.

Figure 3:
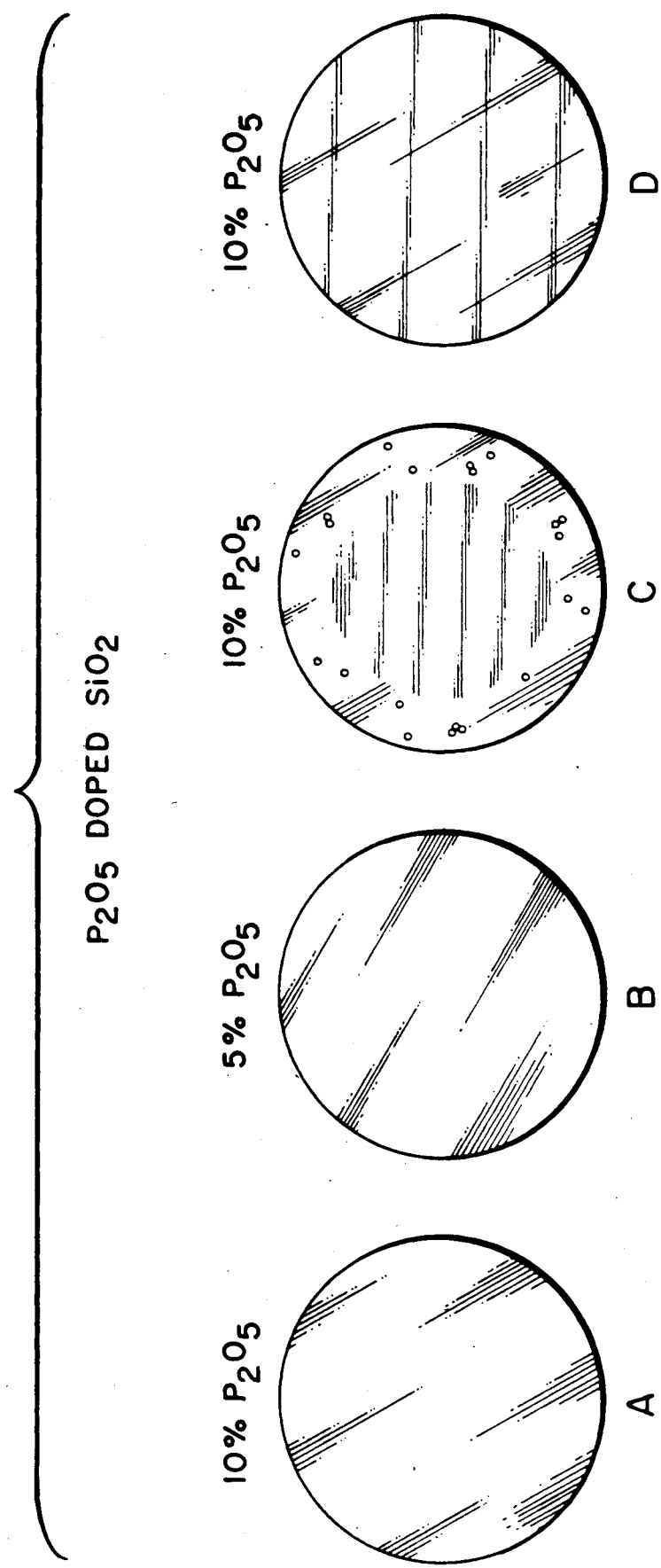
FIG. 3(A–D) compares pictorial representation of samples of $P_2O_5$-doped $SiO_2$ sintered at different processing conditions.

FIG. 3 shows the effect of a few sintering conditions on three samples (A, C and D) containing approximately 10 mole % $P_2O_5$ and one (B) containing approximately 5 mole % $P_2O_5$. All of these samples were dehydrated at 650° C. for 2 hours in a flowing atmosphere of 8.5% $Cl_2$, 2.5% $SiF_4$, and 89% He by volume. This treatment reduced the OH-concentration to less than .07 ppm as measured by Infrared Spectroscopy.

Sample A was heated from the dehydration temperature to 1125° C. at a rate of about 146° C./hr and furnace cooled. This was found to result in optimal sintering conditions and was translucent. Sample B which contained only 5 mole % $P_2O_5$ was fired under similar conditions to that of sample A and it also sintered to transparent, pore-free glass.

In contrast, sample C which was heated from the dehydration temperature to 1200° C. at a rate of 600° C./hr., has not reached its theoretical density. Although this sample showed no signs of crystallization, the central portion of the sample was opaque due to retained porosity, while the outer edge was transparent, but contained bubbles. The bubbles were due to phosphorus evaporation. This indicates that this schedule was too rapid to allow densification and the temperature was too high to retain all of the phosphorus present in the dried gel. Sample D which was heated from the dehydration step to 1050° C. at a rate of 133° C./hr. and was held at this temperature for 15 minutes, also demonstrated an opaque core and glassy surface. Unlike Sample C, the opacity in this sample was due to crystallization, as confirmed by X-ray diffraction, which occured during the slower heat-up and soak.

A specific illustrative example for preparation of PSG targets containing 6 mole percent $P_2O_5$ and 94 mole percent $SiO_2$ is given below. The conditions of this example may be easily modified to produce targets containing different amounts of $P_2O_5$. For example, Table I discloses relative amounts by weight of fumed silica, phosphoric acid and water needed to prepare a sol containing from 1 to 12 mole percent $P_2O_5$. In this table, the $SiO_2$ is a fumed silica with surface area of about 200 m²/g, the phosphoric acid is a reagent grade aqueous phosphoric acid (85 weight % $H_3PO_4$), and water is a triple-distilled water. The amount of water actually added for each mixture is smaller than a total which is needed. That is, to produce a sol with 38 wt. % $SiO_2$ and 1 mole % $P_2O_5$, one should add only 237.8 gram water, the remainder (2.2 g) being provided by the phosphoric acid.

The amounts given shall result in approximately 38, 35 and 33 weight percent of silica in the resultant sol. Sols with different silica contents, e.g. 30 to 50 weight percent, may be produced by varying the amount of water being added, that is selecting different silica to water ratios.

EXAMPLE 600 grams of fumed silica with a surface area of 200 m²/g were mixed with 1023 grams of triple-distilled water and 148 grams of an aqueous solution of 85 weight percent $H_3PO_4$. These amounts corresponded to 150/270 silica to water ratio and 6 mole % $P_2O_5$, as

TABLE I

| Mole % $P_2O_5$ | 1 | 2 | 3 | 4 | 5 | 6 | 7 | 8 | 9 | 10 | 11 | 12 |
|---|---|---|---|---|---|---|---|---|---|---|---|---|
| Wt. of $SiO_2$ | 150 | 150 | 150 | 150 | 150 | 150 | 150 | 150 | 150 | 150 | 150 | 150 |
| Wt. $H_3PO_4$ (85% by Wt.) | 5.81 | 11.76 | 17.79 | 24.12 | 30.31 | 36.98 | 43.30 | 49.99 | 56.86 | 63.88 | 71.02 | 78.60 |
| Wt. Water* | 237.8 | 235.48 | 233.16 | 230.73 | 228.35 | 225.79 | 223.37 | 220.79 | 218.15 | 215.46 | 212.72 | 209.80 |
| Wt. Water** | 267.8 g | 265.5 g | 263.20 | 260.73 | 258.35 | 255.79 | 253.37 | 250.79 | 248.15 | 245.46 | 242.72 | 239.80 |
| Wt. Water*** | 297.8 | 295.48 | 293.16 | 290.73 | 288.35 | 285.79 | 283.37 | 280.79 | 278.15 | 275.46 | 272.72 | 269.80 |

*Wt. Water for $SiO_2/H_2O$ Ratio of 150/240 (~38 wt. % $SiO_2$)
**Wt. Water for $SiO_2/H_2O$ Ratio of 150/270 (~35 wt. % $SiO_2$)
***Wt. Water for $SiO_2/H_2O$ Ratio of 150/300 (~33 wt. % $SiO_2$)

disclosed in Table I. After a suitable period of mixing to interdisperse the ingredients (typically 1–2 minutes), the sol was poured into an open container, and was permitted to gel. The mixture gelled in about one hour. This gel was then dried at room temperature and approximately 60% relative humidity for a period of up to three days until the gel broke up into pieces from 1 to 10 cm to a side.

The pieces were then put into a silica boat and heat-treated in a tightly sealed silica muffle tube furnace (5 cm. diameter) as follows:

a) The samples were dehydrated by heating at about 300 degrees C per hour to 650° C. in helium flowing through the tube at about 1 liter per minute; this was followed by soaking the samples at about 650° C. for two hours in an atmosphere of approximately 8.5 percent $Cl_2$, 2.5 percent $SiF_4$ and 89 percent He (all by volume).

b) Thereafter, the samples were sintered (densified) by heating from the dehydrating temperature at 160° C. per hour in helium (flowing at about 1 liter per minute) to 1150° C. and, upon reaching this temperature, furnace cooled.

This processing resulted in clear, clean glass samples, of a kind described with reference to FIG. 3A and 3B, suitable as target material for e-beam deposition.

PSG coatings deposited on semiconductor surfaces may favorably compete with coatings of commercially available Vycor ® glasses, such as Vycor 7913 containing 3% $B_2O_3$, 1% $Al_2O_3$ and 96% $SiO_2$, by weight, due to excellent adherence qualities of the PSG even when deposited on the semiconductor surface kept at room temperature, and especially when processing fine details (e.g. on the order of the design magnitude of 1μm).

When PSG coatings are used in processing fine details with relatively thin coatings, e.g. 10–100 nm thick, and fine pattern delineation, the advantages of the use of the PSG coatings for deposition on a surface held at room temperature (r.t.) become more pronounced, as is evident from Table II. In this table, PSG contained 6 mole percent $P_2O_5$. Other PSGs at least containing from 1 to 15 mole % $P_2O_5$ are expected to behave similarly. For fine detailing, both glasses serve well when deposited at such higher temperatures as 250° C.; however, PSG adheres better than Vycor 7913 glass when deposited at room temperature. For use in rapid thermal annealing (RTA) capping coatings of PSG and Vycor 7913 when deposited on a surface, such as InP or GaAs, held at room temperature (r.t.), or at a higher temperature, such as ranging from 200°–350° C., adhere relatively comparably, with adherence at the higher temperatures being somewhat better than at lower, e.g. room, temperatures. The reason probably resides in the use of a relatively large thickness of the deposit for purposes of RTA (e.g. 100–500 nm thick). Nonetheless, a glass that is less sensitive to the temperature of the semiconductor surface during the deposition is commercially advantageous, especially in large scale processing.

TABLE II

| Material | Deposition Temperature | Glass Deposited | Detail Integrity |
|---|---|---|---|
| InP | r.t. | PSG | fair |
| " | 250 C. | " | very good |
| " | r.t. | Vycor 7913 | peels |
| " | 250 C. | " | very good |
| GaAs | r.t. | PSG | very good |
| " | 250 C. | " | very good |
| " | r.t. | Vycor 7913 | fair |
| " | 250 C. | " | very good |

We claims:

1. A process for fabricating a semiconductor device, which comprises depositing by a particle beam deposition a phosphosilicate glass target material on at least a portion of a semiconductor surface so that said at least a portion of said surface is covered with a contacting phosphosilicate glass region comprising from 1 to 15 mole percent $P_2O_5$, wherein said glass material is prepared by a procedure comprising the steps of
   a) forming a gel by mixing together fumed silica, aqueous solution of reagent grade phosphoric acid and water, and permitting said sol to gel, said silica having surface area within a range of from 50 to 400 m²/g and is added in an amount sufficient to form a sol containing from 20 to 55 weight percent silica,
   b) drying said gel at ambient atmosphere and temperature conditions for a period of up to 14 days,
   c) dehydrating the dried gel by heating at a rate of from 250 to 350 degrees per hour to a temperature within a range of from 500 to 700 degrees C., and maintaining at said temperature for a period of from 10 minutes to three hours, d) sintering the dehydrated gel into glass by heating the gel at a rate of from 100 to 180 degrees C. per hour from said dehydrating temperature to a desired peak temperature within a range of from 600 to 1200 degrees C., and e) cooling the sintered glass, preferably upon reaching said peak temperature, said dehydrating and sintering stages being conducted in a flowing atmosphere comprising an inert gas.

2. The process of claim 1 in which the glass material region comprises 1-12 mole percent $P_2O_5$.

3. The process of claim 1 in which the glass material region consists essentially of 2-10 mole percent $P_2O_5$, remainder $SiO_2$.

4. The process of claim 1 in which said silica comprises surface area within a range of from 150 to 250 $m^2/g$.

5. The process of claim 1 in which said silica comprises surface area of approximately 200 $m^2/g$.

6. The process of claim 1 in which said silica is added so as to form a sol containing from 30 to 50 weight percent silica.

7. The process of claim 1 in which said drying of the gel is conducted for a period of up to three days.

8. The process of claim 1 in which said dried gel is heated at a rate of about 300° C./hr to said dehydrating temperature.

9. The process of claim 1 in which said dehydration is accomplished by heating the dried gel at a temperature of about 650° C. for a period of two hours.

10. The process of claim 1 in which said heating from the dehydrating to the peak sintering temperature is conducted at a rate of from 140° to 150° C. per hour.

11. The process of claim 10 in which said heating rate is about 145° C. per hour.

12. The process of claim 1 in which said peak sintering temperature is within a range of from 1000° to 1200° C.

13. The process of claim 12 in which said peak sintering temperature is about 1125° C.

14. The process of claim 1 in which said inert gas comprises helium.

15. The process of claim 1 in which said dehydration is conducted in an atmosphere comprising in addition to the inert gas at least one of $Cl_2$, $SiF_4$, fluorocarbons, chlorofluorocarbons and $CCl_4$.

16. The process of claim 1 in which said dehydration is conducted in an atmosphere comprising about 8.5% $Cl_2$, 2.5% $SiF_4$ and 89% He, by volume.

17. The process of claim 1 in which the particle beam procedure is an e-beam deposition.

18. The process of claim 1 in which the semiconductor comprises III-V semiconductor compound.

19. The process of claim 18 in which the III-V semiconductor compound is selected from the group consisting of InP and GaAs and compounds lattice matched to InP and GaAs.

20. The process of claim 1 in which the phosphosilicate glass region contacts an ion implanted surface.

21. The process of claim 20 in which the ion implanted surface with contacting glass material is annealed to activate the ion implant, the semiconductor material is GaAs and the anneal is a Rapid Thermal Anneal conducted at a temperature within a range of from 750° to 1000° C. for a period of from 10 seconds to 10 minutes, the lower temperatures corresponding to longer times.

22. The process of claim 21 in which the Rapid Thermal Anneal carried out at a temperature within a range of from 800 to 1000 degrees C., for about 10 seconds, and at a temperature within a range of from 750 to 850 degrees C., for about 10 minutes.

23. The process of claim 1 in which
said phosphosilicate glass contains from 1 to 12 mole percent $P_2O_5$ remainder $SiO_2$, said silica has surface area of about 200 $m^2/g$, and is combined with water and phosphoric acid to form a sol containing from 30 to 50 weight percent silica, the phosphoric acid is added in an amount to obtain a desired content of $P_2O_5$ in the glass, said gel is dried for a period of up to three days, the dried gel is dehydrated by heating at a rate of about 650° C. which then is maintained for two hours, said dehydration being carried out in a flowing atmosphere including helium, $Cl_2$ and $SiF_4$, the dehydrated gel is heated at a rate of from 140° to 150° C. per hour to a peak temperature of from 1000° to 1175° C. and then is furnace cooled.

24. The process of claim 1 wherein said semiconductor surface is a surface of a compound semiconductor selected from InP and GaAs, and said device is an avalanche photodetector.

25. A process of producing phosphosilicate glass target material comprising from 1 to 15 mole percent $P_2O_5$, suitable for particle beam deposition, comprising the steps of a) forming a gel by mixing together fumed silica, aqueous solution of reaction grade phosphoric acid and water and permitting the sol to gel, said silica having surface area within a range of from 50 to 400 $m^2/g$ and is added in an amount sufficient to form a sol containing from 20 to 55 weight percent silica, b) drying said gel at ambient atmosphere and temperature conditions for a period of up to 14 days, c) dehydrating the dried gel by heating the gel at a rate of from 250 to 350 degrees per hour to a temperature within a range of from 500 to 700 degrees C., and maintaining at said temperature for a period of from 10 minutes to three hours, d) sintering the dehydrated gel into glass by heating the gel at a rate of from 100 to 180 degrees C. per hour from said dehydrating temperature to a desired peak temperature within a range of from 600 to 1200 degrees C., and e) cooling the sintered glass, preferably upon reaching said desired peak temperature, said dehydrating and sintering stages being conducted in a flowing atmosphere comprising an inert gas.

26. The process of claim 25 in which the glass material region comprises 1-12 mole percent $P_2O_5$.

27. The process of claim 25 in which the glass material region consists essentially of 2-10 mole percent $P_2O_5$, remainder $SiO_2$.

28. The process of claim 25 in which said silica comprises surface area within a range of from 150 to 250 $m^2/g$.

29. The process of claim 25 in which said silica comprises surface area of about 200 $m^2/g$.

30. The process of claim 24 in which said silica is added so as to form a sol containing from 30 to 50 weight percent silica.

31. The process of claim 25 in which said drying of the gel is conducted for a period of up to three days.

32. The process of claim 25 in which said dried gel is heated at a rate of about 300° C./hr. to said dehydrating temperature.

33. The process of claim 25 in which said dehydration is accomplished by heating the dried gel at a temperature of about 650° C. for a period of two hours.

34. The process of claim 25 in which said heating from the dehydrating to the peak sintering temperature is conducted at a rate of from 140° to 150° C. per hour.

35. The process of claim 34 in which said heating rate is about 145° C. per hour.

36. The process of claim 25 in which said peak sintering temperature is within a range of from 1000° to 1200° C.

37. The process of claim 36 in which said peak sintering temperature is about 1125° C.

38. The process of claim 25 in which said inert gas comprises helium.

39. The process of claim 25 in which said dehydration is conducted in an atmosphere comprising in addition to the inert gas, at least one of $Cl_2$, $SiF_4$, fluorocarbons, chlorofluorocarbons and $CCl_4$.

40. The process of claim 25 in which said dehydration is conducted in an atmosphere comprising about 8.5% $Cl_2$ 2.5% $SiF_4$ and 89% He, by volume.

41. The process of claim 25 in which said phosphosilicate glass contains from 1 to 12 mole percent $P_2O_5$ remainder $SiO_2$, said silica has surface area of about 200 m²/g, and is combined with water and phosphoric acid to form a sol containing from 30 to 50 weight percent silica, the phosphoric acid is added in an amount to obtain a desired content of $P_2O_5$ in the glass, said gel is dried for a period of up to three days, the dried gel is dehydrated by heating at a rate of about 650° C. which then is maintained for two hours, said dehydration being carried out in a flowing atmosphere including helium, $Cl_2$ and $SiF_4$, the dehydrated gel is heated at a rate of from 140° to 150° C. per hour to a peak temperature of from 1000° to 1175° C. and then is furnace cooled.

* * * * *